(12) United States Patent
Cho et al.

(10) Patent No.: US 6,734,113 B1
(45) Date of Patent: May 11, 2004

(54) METHOD FOR FORMING MULTIPLE GATE OXIDE LAYERS

(75) Inventors: Heung-Jae Cho, Ichon-shi (KR); Kwan-Yong Lim, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/601,869

(22) Filed: Jun. 24, 2003

(30) Foreign Application Priority Data

Dec. 30, 2002 (KR) ................................ 10-2002-0086277

(51) Int. Cl.$^7$ ............................................. H01L 21/00
(52) U.S. Cl. ..................... 438/763; 438/776; 438/981
(58) Field of Search ..................... 438/763, 775–777, 438/981

(56) References Cited

U.S. PATENT DOCUMENTS

| | | | |
|---|---|---|---|
| 5,254,489 A | * 10/1993 | Nakata | ....................... 438/258 |
| 6,110,842 A | 8/2000 | Okuno et al. | |
| 6,261,972 B1 | * 7/2001 | Tews et al. | .................. 438/766 |
| 6,331,492 B2 | * 12/2001 | Misium et al. | ............. 438/762 |

* cited by examiner

*Primary Examiner*—Richard A. Booth
(74) *Attorney, Agent, or Firm*—Jacobson Holman PLLC

(57) ABSTRACT

The present invention provides a method for forming multiple gate oxide layers with different thickness in one chip by using a simple process. Particularly, a series of processes such as the first oxidation, the nitridation, the wet dip-out and the second oxidation contribute to form the gate oxide layer having different thicknesses. As a result, it is possible to integrate those various devices having different driving voltages into one chip. It is further possible to manufacture diverse products with improvements on layout design and device and process margins.

7 Claims, 6 Drawing Sheets

METHOD FOR FORMING MULTIPLE GATE OXIDE LAYERS

FIELD OF THE INVENTION

The present invention relates to a semiconductor device; and, more particularly, to a method for forming multiple gate oxide layers.

DESCRIPTION OF RELATED ARTS

It has been recently researched on System On Chip (SOC) technology that enables various devices with different purposes to be formed in one chip in order to satisfy requirements and needs of diverse products. In such SOC technology, each device has a, different driving voltage and includes gate oxide layers having different thicknesses obtained by using different processes are formed. That is, a high voltage device supplied with a high voltage needs a thick oxide layer for improving reliability, and a low voltage device focusing on a driving speed of the device needs a thin oxide layer.

It is a dual gate oxide layer formation technology developed to meet the above demand.

Instead of using different processes to provide different thicknesses to two devices, gate oxide layers having different thicknesses are formed in a device divided into three different regions within one chip, thereby improving layout and margins of the device and manufacturing various products. For instance, it is possible to form each gate oxide layer into a high voltage device, a low voltage device and a medium voltage device based on its appropriate purpose.

Accordingly, it is required of such multiple gate oxide layer formation technology capable of varying a thickness of the gate oxide layer according to a particular purpose of a device.

A conventional multiple gate oxide technique is disclosed in U.S. Pat. No. 6,110,842 issued on Aug. 29, 2000.

FIGS. 1A to 1C are cross-sectional views showing a method for forming multiple gate oxide layers according to a prior art.

Referring to FIG. 1A, a resist pattern 12 exposing a partial portion 16 of a semiconductor substrate 10 is formed on the semiconductor substrate 10. An oxynitride layer or a thin nitride layer 18 is formed on the exposed semiconductor substrate 10 by using a high-density plasma nitridation technique.

Referring to FIG. 1B, the resist pattern is then removed.

Referring to FIG. 1C, dual gate oxide gate layers of a thick silicon oxide layer 20A and a thin silicon oxide layer 20B are formed on the semiconductor substrate 10 through an oxidation process.

At this time, the nitride layer 18 formed on the partial portion 16 of the semiconductor substrate 10 delays the oxidation on the surface of the semiconductor substrate 10 so that the thinner silicon oxide layer 20B is formed on the partial portion 16. The thick oxide layer 20A is formed on a surface 14 of the semiconductor substrate 10 without the nitride layer 18.

In the above-described prior art, only the dual gate oxide layers are formed since the surface of the semiconductor substrate is selectively proceeded with the nitridation. There is also a disadvantage of complicating the process if this conventional technique is applied to form multiple gate oxide layers.

SUMMARY OF THE INVENTION

It is, therefore, an object of the present invention to provide a method for forming multiple gate oxide layers capable of overcoming limitations in a dual gate oxide layer technology based on a conventional nitridation method and forming diverse devices including multiple gate oxide layers with different thicknesses in one chip by using a simple process.

In accordance with an aspect of the present invention, there is provided a method for forming multiple oxide layers, including the steps of: forming a first gate oxide layer on a semiconductor substrate; forming a first masking layer on the first gate oxide layer, the first masking layer covering a first region of the first gate oxide layer; performing nitridation to a surface of a second region of the first gate oxide layer exposed by the first masking layer; removing the first masking layer; forming a second masking layer covering the first and the second regions of the first gate oxide layer but exposing a partial portion of the second region, the partial portion is defined as a third region of the first gate oxide layer; exposing a surface of the semiconductor substrate by etching the third region of the first gate oxide layer exposed by the second masking layer; and forming a second gate oxide layer on the exposed semiconductor substrate and the first region of the first gate oxide layer.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

FIGS. 2A to 2E are cross-sectional views showing a method for forming multiple gate oxide layers in accordance with a preferred embodiment of the present invention.

Figure 2A:
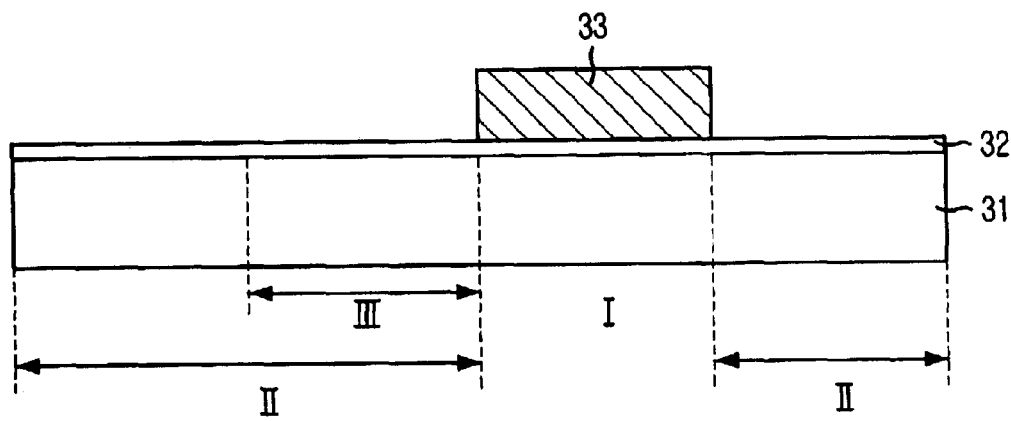
FIGS. 2A to 2E are cross-sectional views showing a method for forming multiple gate oxide layers in accordance with a preferred embodiment of the present invention.

Referring to FIG. 2A, on a semiconductor substrate 31, a first gate oxide layer 32 is formed with a thickness ranging from about 5 Å to about 200 Å through a first oxidation process. For instance, the first oxide layer 32 is divided into a first region I and a second region II.

Then, a photosensitive film is coated on the first oxide layer 32 and patterned through a photo-exposure and developing process so as to form a first masking layer 33 that covers the first region I and opens the second region II.

Figure 2B:
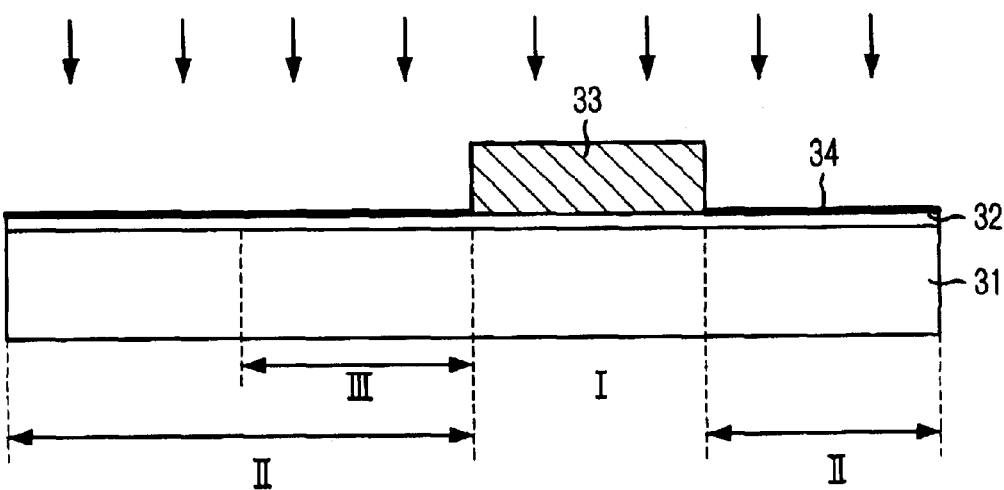

Referring to FIG. 2B, a surface of the second region II of the first gate oxide layer 32 exposed by the first masking layer 33 is proceeded with nitridation so that a nitride layer 34 is formed on the first gate oxide layer 32.

At this time, a plasma nitridation technique is used for the nitridation of a surface of the first gate oxide layer 32. For instance, the nitridation is carried out by directly generating nitrogen plasma on an upper part of the first gate oxide layer 32 surface, or by generating nitrogen plasma at a different place and adding only nitrogen radicals onto the first gate oxide layer 32 surface.

Such plasma nitridation technique uses a source gas containing nitrogen selected from a group consisting of $N_2$, NO, $N_2O$, $NH_3$, $NF_3$ or a mixed gas of the above or a mixed source gas obtained by adding $O_2$ or $O_3$ to the source gas.

Also, the plasma nitridation technique is proceeded by supplying source power of about 100 W to about 1000 W and bias power of about 0 W to about 10 W and maintaining a semiconductor substrate temperature in a range between about 0° C. to about 600° C. Particularly, the plasma nitridation technique is carried out for about 5 to 500 seconds. The source gas is also flowed in la range from about 5 sccm to about 500 sccm.

A nitrogen concentration of the nitride layer 34 formed on the surface of the first gate oxide layer 32 through the above plasma nitridation technique ranges between about 2% to about 20%.

Figure 2C:
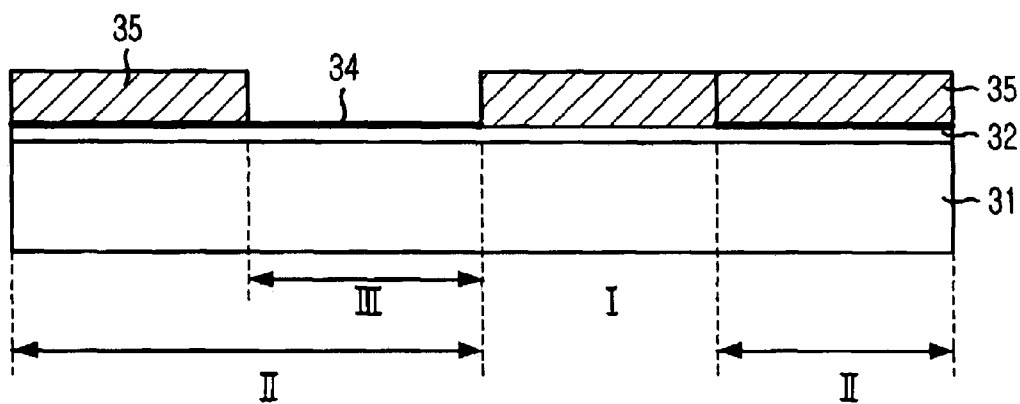

Referring to FIG. 2C, the first masking layer 33 is removed. At this time, the removal of the first masking layer 33 occurs by employing a dry etching technique using oxygen plasma, a wet etching technique using $H_2SO_4$ or an etching technique using a thinner.

Next, a photosensitive film is coated on the above structure and patterned through a photo-exposure and developing process so as to make a partial portion of the second region II of the first gate oxide layer 32 opened and form a second masking layer 35 covering the rest of the first and the second regions I and II except the above partial portion thereof. Herein, the partial portion of the second region II is called a third region III hereinafter.

Figure 2D:
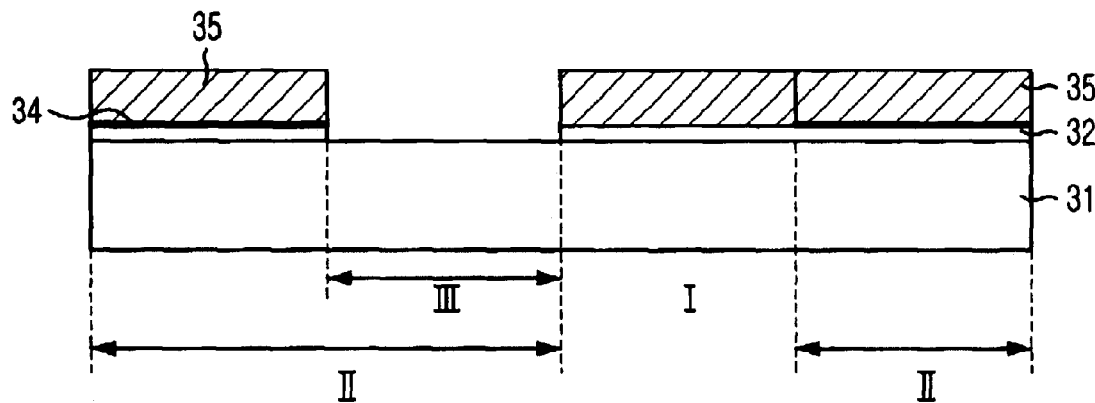

With reference to FIG. 2D, the nitride layer 34 and the first gate oxide layer 32 of the third region III exposed by the second masking layer 35 area removed through a wet dip-out technique, whereby a surface of the semiconductor substrate 31 is exposed.

At this time, the wet dip-out technique uses HF based or buffered oxide etchant (BOE) based wet chemicals.

Figure 2E:
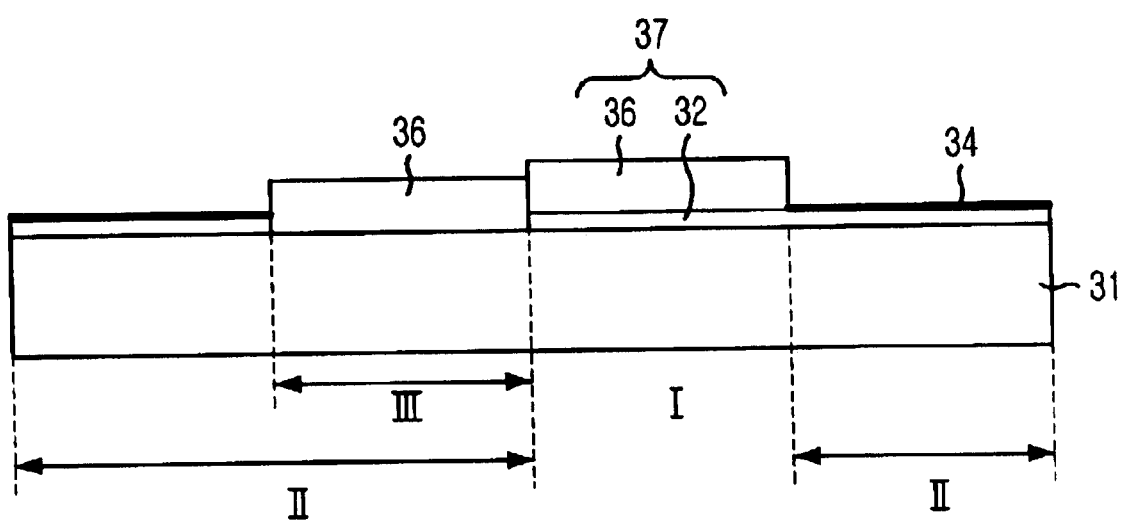

With reference to FIG. 2E, the remaining second masking layer 35 is removed by employing a dry etching technique using oxygen plasma, a wet etching technique using $H_2SO_4$ or an etching technique using a thinner.

As described above, after the removal of the second masking layer 35, the first gate oxide layer 32 of the first region I maintains its original thickness. Also, the first gate oxide layer 32 of the second region II except for the third region III is remained with the same thickness although the nitride layer 34 is formed thereon. Eventually, the first gate oxide layer 32 and the nitride layer 34 are not remained on the third region III.

Afterwards, a second gate oxide layer 36 is formed through the use of a second oxidation process. At this time, the second gate oxide layer 36 of the second region II to be deposited on the nitride layer 34 is suppressed from a re-growth. In contrast, the second gate oxide layer 36 is formed only on the third region III and the first region I. That is, since the nitride layer 34 has an effect of suppressing the oxidation, the re-growth of the second gate oxide layer 36 on the second region II except for the third region III is suppressed.

Therefore, it is possible to form triple gate oxide layers including; the first gate oxide layer 32 having the most thin thickness with the nitride layer 34 formed through the nitridation on the surface :of the semiconductor substrate 31; the second gate oxide layer 36 having a medium thickness; and a third gate oxide layer 37 on the region I, which has the most thick thickness by being stacked of the first gate oxide layer 32 and the second oxide layer 36.

Meanwhile, a thickness of the first gate oxide layer 32, a degree of the nitridation of the first gate oxide layer 32 and particular conditions for the second oxidation process are variables for conveniently controlling the required thickness of each gate oxide layer in accordance with its appropriate purpose.

Figure 1A:
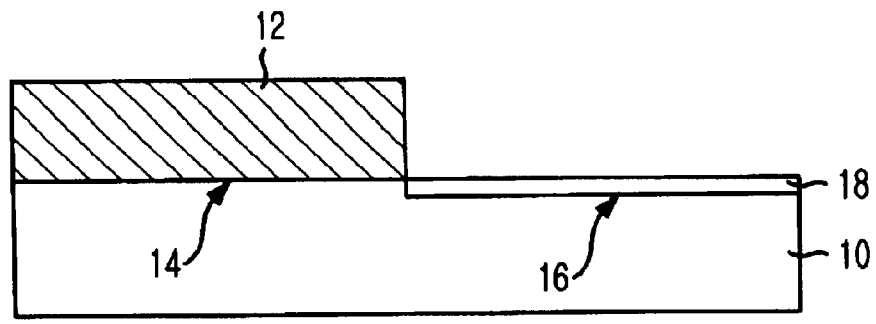
FIGS. 1A to 1C are cross-sectional views showing a method for forming multiple gate oxide layers according to a prior art.
Figure 1B:
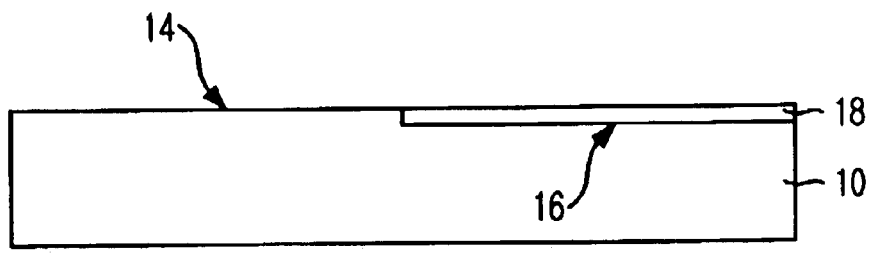
Figure 1C:
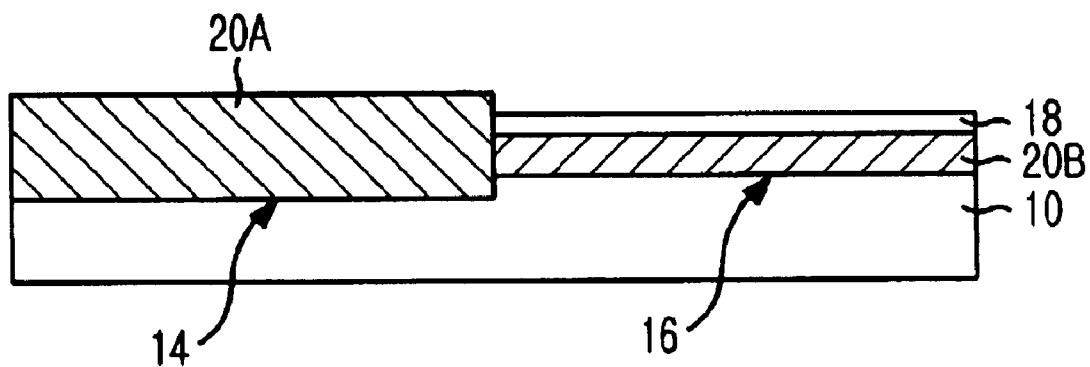

Compared to FIG. 1 showing a method for forming dual gate oxide layers through a selective nitridation of a semiconductor substrate surface, the present invention provides triple gate oxide layers in addition to the dual gate oxide layers due to a selective nitridation of the first gate oxide layer surface and variable thickness with use of the first gate oxide layer.

Figure 3:
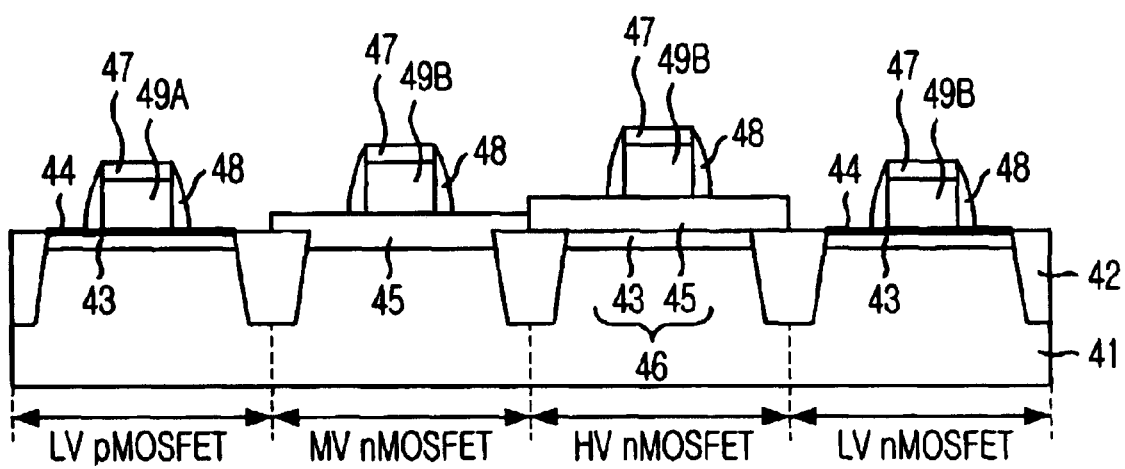
FIG. 3 is a cross-sectional view showing a semiconductor substrate with diverse devices formed in one chip through the use of the multiple gate oxide layer formation method.

FIG. 3 is a cross-sectional view showing a semiconductor substrate with various devices formed in one chip with use of the multiple gate oxide layer formation method.

Referring to FIG. 3, on a semiconductor substrate 41 providing a low voltage (LV) p-channel metal-oxide-semiconductor field effect transistor (pMOSFET), a medium voltage (MV) nMOSFET, a high voltage (HV) nMOSFET and a LV nMOSFET, a field oxide layer 41 for dividing such MOSFETs is formed thereon. At each of the MOSFETS, a gate oxide layer with different thicknesses is formed.

Firstly, at the LV pMOSFET and LV nMOSFET, a thin first gate oxide layer 43 is formed and a nitride layer 44 is subsequently formed thereon. A second gate oxide layer 45 thicker than the first gate oxide layer 43 is formed at the MV nMOSFET. A thick gate oxide layer 46 formed by stacking the first gate oxide layer 43 and the second gate oxide layer 45 is formed at the HV nMOSFET.

At the LV pMOSFET, a gate electrode 49A using a polysilicon layer implanted with a p-type dopant (hereinafter referred as to $P^+$ polysilicon layer) is formed at a predetermined portion of the first gate oxide layer 43 including the nitride layer 44, and a hard mask 47 is stacked thereon. Then, a spacer 48 is formed at lateral sides of the stacked gate electrode 49A and the hard mask 47.

It is possible to realize systematic threshold voltage because of a selective application of the $P^+$ polysilicon layer to a surface channel owing to the fact that the first gate oxide layer 43 of which surface is proceeded with the nitridation is used.

Next, at the LV nMOSFET, the MV nMOSFET and the HV nMOSFET, a gate electrode 49B using an n-type dopant implanted polysilicon layer is formed at a predetermined portion of each gate oxide layer, and a hard mask 47 is stacked thereon. A spacer 48 is subsequently formed at lateral sides of the stacked gate electrode 49B and the hard mask 47.

In FIG. 3, the gate oxide layer at each MOSFET has a different thickness from each other, resulting in a different height of each gate electrode.

When various devices requiring different thicknesses of the gate oxide layer are formed, in one chip as shown in FIG. 3, a series of processes such as the first oxidation, the nitridation, the wet dip-out and the second oxidation contribute to form the gate oxide layer having different thicknesses. As a result, it is possible to integrate those various devices having different driving voltages into one chip. It is further possible to manufacture diverse products with improvements on layout design and device and process margins.

While the present invention has been described with respect to certain preferred embodiments, it will be apparent to those skilled in the art that various changes and modifications may be made without departing from the scope of the invention as defined in the following claims.

What is claimed is:

1. A method for forming multiple oxide layers, comprising the steps of:
    forming a first gate oxide layer with a first predetermined thickness on a semiconductor substrate;
    forming a first masking layer on the first gate oxide layer, the first masking layer defining a first region of the first gate oxide layer;
    performing nitridation to a surface of a second region of the first gate oxide layer exposed by the first masking layer;
    removing the first masking layer;
    forming a second masking layer covering the first and the second regions of the first gate oxide layer but exposing a partial portion of the second region, the partial portion being defined as a third region of the first gate oxide layer;
    exposing a surface of the semiconductor substrate by etching the third region of the first gate oxide layer exposed by the second masking layer; and
    forming a second gate oxide layer with a second predetermined thickness on the exposed semiconductor substrate and the first region of the first gate oxide layer to thereby form a third gate oxide layer on the first region with a thickness combined of the first predetermined thickness and the second predetermined thickness.

2. The method as recited in claim 1, wherein the step of performing the nitridation to the surface of the second region of the first gate oxide layer uses a plasma nitridation technique.

3. The method as recited in claim 2, wherein the plasma nitridation technique uses a source gas containing nitrogen selected from a group consisting of $N_2$, NO, $N_2O$, $NH_3$, $NF_3$ or a mixed gas of the above or a mixed source gas obtained by adding $O_2$ or $O_3$ to the source gas.

4. The method as recited in claim 2, the plasma nitridation technique includes nitrogen flowed in a range between about 5 sccm to about 500 sccm.

5. The method as recited in claim 2, wherein the plasma nitridation technique generates plasma by supplying a source power ranging from about 100 W to about 1000 W and a bias power ranging from about 0 W to about 10 W, and is carried out with a semiconductor substrate temperature ranging from about 0° C. to about 600° C. for about 5 to about 500 seconds.

6. The method as recited in claim 1, wherein the step of exposing the surface of the semiconductor substrate by etching the third region is carried out by using a wet dip-out technique.

7. The method as recited in claim 6, wherein the wet dip-out technique uses wet chemicals such as HF based family or BOE based family.

* * * * *